US012796356B2

(12) United States Patent
Tsubota et al.

(10) Patent No.: US 12,796,356 B2
(45) Date of Patent: Nov. 10, 2026

(54) METHOD OF PROCESSING SUBSTRATE, METHOD OF MANUFACTURING SEMICONDUCTOR DEVICE, RECORDING MEDIUM, AND SUBSTRATE PROCESSING APPARATUS

(71) Applicant: KOKUSAI ELECTRIC CORPORATION, Tokyo (JP)

(72) Inventors: Yasutoshi Tsubota, Toyama (JP); Kimihiko Nakatani, Toyama (JP); Yuki Yamakado, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 950 days.

(21) Appl. No.: 17/946,814

(22) Filed: Sep. 16, 2022

(65) Prior Publication Data

US 2023/0097581 A1 Mar. 30, 2023

(30) Foreign Application Priority Data

Sep. 29, 2021 (JP) ................................ 2021-159797

(51) Int. Cl.

| | |
|---|---|
| ***C23C 8/24*** | (2006.01) |
| ***C23C 8/36*** | (2006.01) |
| ***C23C 8/80*** | (2006.01) |
| ***H10P 14/60*** | (2026.01) |

(52) U.S. Cl.

CPC ............ *H10P 14/6546* (2026.01); *C23C 8/24* (2013.01); *C23C 8/36* (2013.01); *C23C 8/80* (2013.01)

(58) Field of Classification Search

None

See application file for complete search history.

(56) References Cited

U.S. PATENT DOCUMENTS

| | | | |
|---|---|---|---|
| 2006/0234511 | A1 | 10/2006 | Ohuchi |
| 2017/0092647 | A1 | 3/2017 | Nakayama et al. |
| 2017/0342553 | A1 | 11/2017 | Yu et al. |
| 2021/0035801 | A1 | 2/2021 | Waseda et al. |

(Continued)

FOREIGN PATENT DOCUMENTS

| | | | |
|---|---|---|---|
| CN | 113451112 | A | 9/2021 |
| JP | 2006-303063 | A | 11/2006 |

(Continued)

OTHER PUBLICATIONS

Machine translation of WO-2019229785-A1 (Year: 2019).*

(Continued)

*Primary Examiner* — Shamim Ahmed
*Assistant Examiner* — Bradford M Gates
(74) *Attorney, Agent, or Firm* — Volpe Koenig

(57) ABSTRACT

A method of processing a substrate includes: (a) preparing a substrate having a nitrogen-containing film and an oxygen-containing film on a surface of the substrate; and (b) modifying a surface of the nitrogen-containing film to be nitrided by supplying an active species containing nitrogen and an active species containing hydrogen, or selectively forming hydroxyl group termination on a surface of the oxygen-containing film by supplying at least one selected from the group of an active species containing hydrogen, an active species containing hydrogen and oxygen, and an active species containing hydrogen and nitrogen.

18 Claims, 13 Drawing Sheets

(56) References Cited

U.S. PATENT DOCUMENTS

| | | | |
|---|---|---|---|
| 2021/0098258 A1 | 4/2021 | Degai et al. | |
| 2021/0143001 A1 | 5/2021 | Ashihara et al. | |
| 2021/0305045 A1 | 9/2021 | Ueda et al. | |
| 2022/0005685 A1 | 1/2022 | Degai et al. | |

FOREIGN PATENT DOCUMENTS

| | | | | |
|---|---|---|---|---|
| JP | 2008-091667 A | | 4/2008 | |
| JP | 2017-069254 A | | 4/2017 | |
| JP | 2021-027067 A | | 2/2021 | |
| WO | WO-2019229785 A1 | * | 12/2019 | ............. H01L 21/31 |
| WO | 2020/188801 A1 | | 9/2020 | |
| WO | 2020/264170 A1 | | 12/2020 | |

OTHER PUBLICATIONS

Japanese Office Action issued on Sep. 19, 2023 for Japanese Patent Application No. 2021-159797.

Extended European Search Report issued on Feb. 10, 2023 for European Patent Application No. 22196216.0.

Korean Office Action issued on Sep. 11, 2024 for Korean Patent Application No. 10-2022-0117066.

Communication Pursuant to Article 94(3) EPC issued on Apr. 5, 2024 for European Patent Application No. 22196216.0.

Chinese Office Action issued on Nov. 29, 2025 for Chinese Patent Application No. 202211055939.9.

* cited by examiner

FIG. 4A Wafer-preparing process
FIG. 4B Surface-modifying process
FIG. 4C Film-forming inhibitor bonding process
FIG. 4D Film-forming process
FIG. 4E Film-forming inhibitor removing process
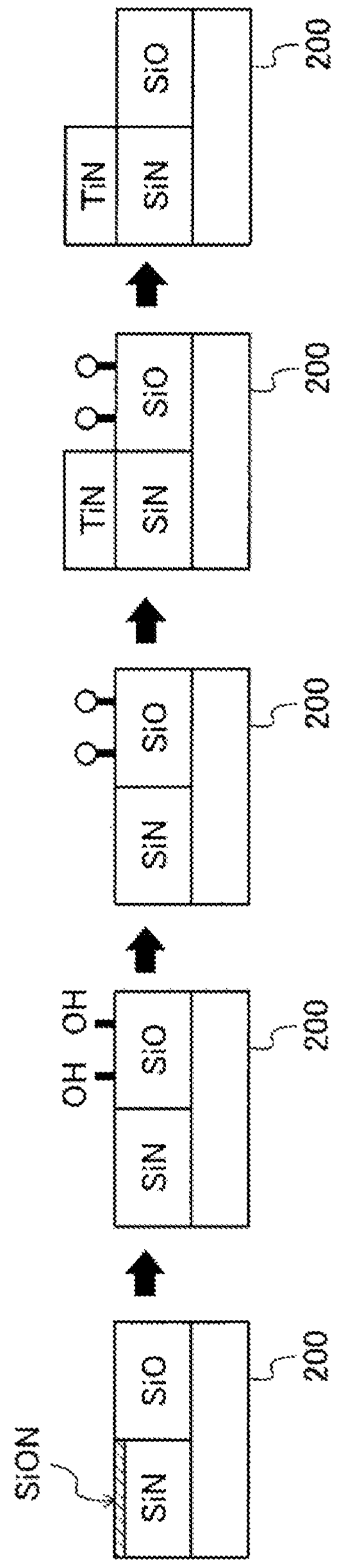

FIG. 7A
FIG. 7B
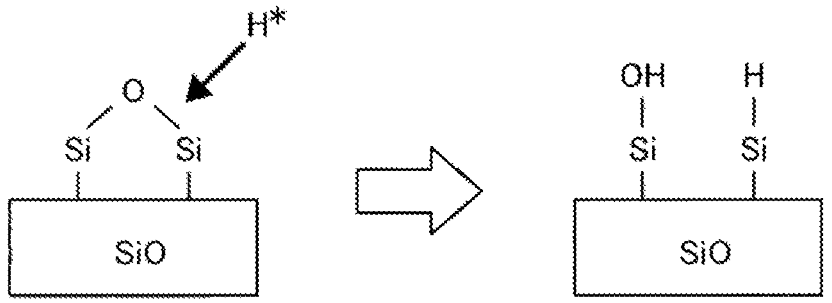
FIG. 8
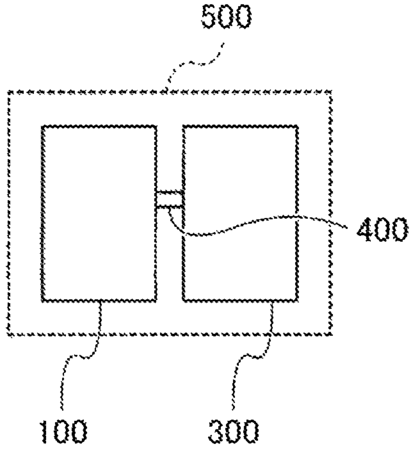

METHOD OF PROCESSING SUBSTRATE, METHOD OF MANUFACTURING SEMICONDUCTOR DEVICE, RECORDING MEDIUM, AND SUBSTRATE PROCESSING APPARATUS

CROSS-REFERENCE TO RELATED APPLICATION

This application is based upon and claims the benefit of priority from Japanese Patent Application No. 2021-159797, filed on Sep. 29, 2021, the entire contents of which are incorporated herein by reference.

TECHNICAL FIELD

The present disclosure relates to a method of processing a substrate, a method of manufacturing a semiconductor device, a recording medium, and a substrate processing apparatus.

BACKGROUND

In a structure having a nitrogen-containing film and an oxygen-containing film formed on a substrate, there is a technique of removing a natural oxide film existing on a surface by hydrofluoric acid treatment, and then selectively modifying the surface.

However, fluorine may remain on the surface of the oxide film after the hydrofluoric acid treatment.

SUMMARY

Some embodiments of the present disclosure provide a technique capable of selectively modifying a surface having a nitrogen-containing film and an oxygen-containing film for each type of film without leaving fluorine behind.

According to embodiments of the present disclosure, there is provided a method of processing a substrate that includes: (a) preparing a substrate having a nitrogen-containing film and an oxygen-containing film on a surface of the substrate; and (b) modifying a surface of the nitrogen-containing film to be nitrided by supplying an active species containing nitrogen and an active species containing hydrogen, or selectively forming hydroxyl group termination on a surface of the oxygen-containing film by supplying at least one selected from the group of an active species containing hydrogen, an active species containing hydrogen and oxygen, and an active species containing hydrogen and nitrogen.

BRIEF DESCRIPTION OF DRAWINGS

The accompanying drawings, which are incorporated in and constitute a part of the specification, illustrate embodiments of the present disclosure.

FIGS. 4A to 4E are diagrams for explaining a modifying sequence in the modifying apparatus. FIG. 4A is a diagram showing a wafer-preparing process, FIG. 4B is a diagram showing a surface-modifying process, FIG. 4C is a diagram showing a film-forming inhibitor bonding process, FIG. 4D is a diagram showing a film-forming process, and FIG. 4E is a diagram showing a film-forming inhibitor removing process.

FIG. 5A is a diagram showing a state in which a nitrogen active species and a hydrogen active species are supplied to a wafer, and FIG. 5B is a diagram showing a state after the surface-modifying process.

FIG. 6A is a diagram showing a state in which a nitrogen active species and a hydrogen active species are supplied to a wafer, FIG. 6B shows a state in which oxygen is released from a nitrogen-containing film on a surface of a wafer, and FIG. 6C is a diagram showing a state in which an active species of a hydroxyl group is bonded to an oxygen-containing film on the surface of the wafer.

FIGS. 7A and 7B are diagrams for explaining a mechanism of the surface-modifying process. FIG. 7A is a diagram showing a state in which an active species of hydrogen is supplied to a nitrogen-containing film on a surface of a wafer, and FIG. 7B is a diagram showing a state in which the nitrogen-containing film on the surface of the wafer is terminated with hydroxyl groups.

FIG. 8 is a diagram showing a substrate processing system.

FIG. 9A is a diagram showing a state in which an active species of hydrogen is supplied to a wafer, and FIG. 9B is a diagram showing a state after the surface-modifying process.

FIG. 10A is a diagram showing a state in which an active species of hydrogen is supplied to the wafer, FIG. 10B is a diagram showing a state in which oxygen is released from a nitrogen-containing film on the surface of the wafer, and FIG. 10C is a diagram showing a state in which an active species of a hydroxyl group is bond to an oxygen-containing film on the surface of the wafer.

FIG. 11A is a diagram showing a state in which an active species of hydrogen and an active species of oxygen are supplied to a wafer, and FIG. 11B is a diagram showing a state after the surface-modifying process.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Hereinafter, a first embodiment of the present disclosure will be described with reference to the drawings. The drawings used in the following description are all schematic. The dimensional relationship of each element on the drawings, the ratio of each element, and the like do not always match the actual ones. Further, even between the drawings, the dimensional relationship of each element, the ratio of each element, and the like do not always match.

(1) Modifying Apparatus

Figure 1:
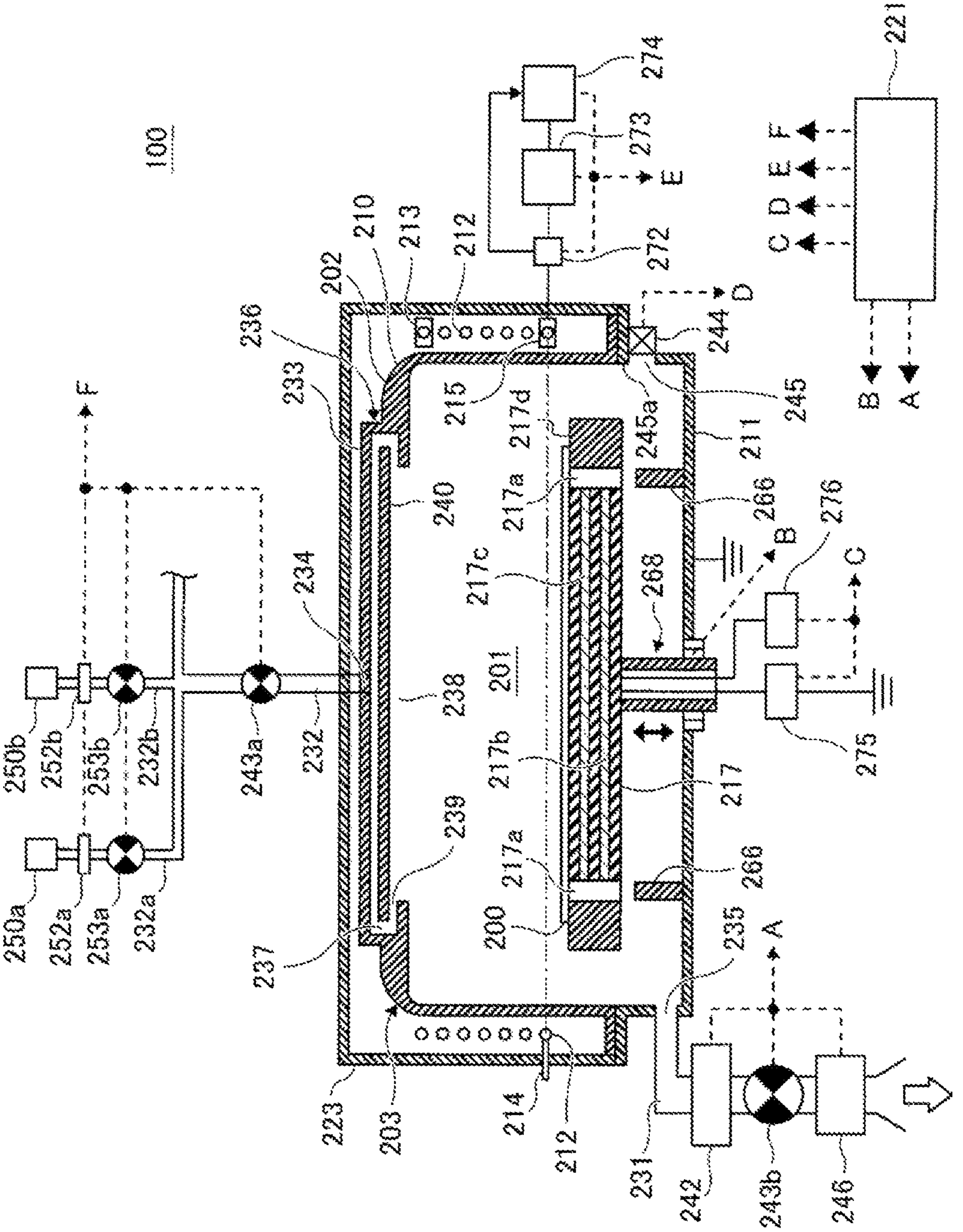
FIG. 1 is a schematic configuration diagram showing a modifying apparatus suitably used in a first embodiment of the present disclosure, in which a portion of a process furnace is shown in a vertical cross-sectional view.

As shown in FIG. 1, the modifying apparatus 100, which is a substrate processing apparatus, includes a process furnace 202 configured to accommodate a wafer 200 as a substrate and perform plasma processing. The process furnace 202 includes a process container 203 that constitutes a process chamber 201. The process container 203 includes a dome-shaped upper container 210 and a bowl-shaped lower container 211. The process chamber 201 is formed by covering the lower container 211 with the upper container 210.

A gate valve 244 as a loading/unloading valve (partition valve) is installed on the lower side wall of the lower container 211. By opening the gate valve 244, the wafer 200 can be loaded and unloaded into and from the process chamber 201 through a loading/unloading port 245. By closing the gate valve 244, the airtightness in the process chamber 201 can be maintained.

Figure 2:
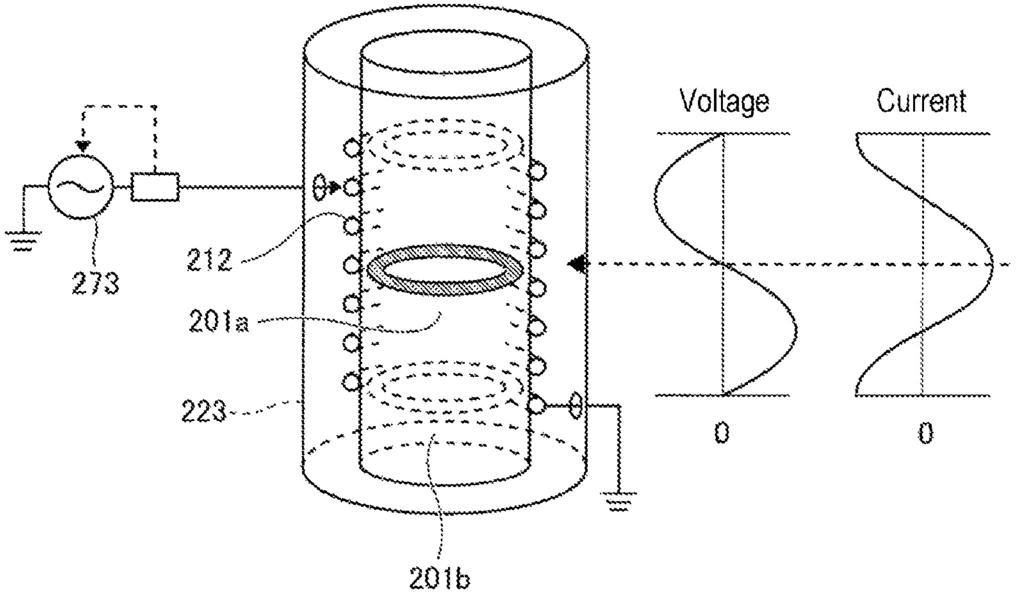
FIG. 2 is a diagram illustrating a principle of plasma generation in the modifying apparatus.

As shown in FIG. 2, the process chamber 201 includes a plasma generation space 201*a* and a modifying space 201*b* which communicates with the plasma generation space 201*a* and in which the wafer 200 is processed. A resonance coil 212, which will be described later, is installed around the plasma generation space 201*a* and on the outer peripheral side of the process container 203. The plasma generation space 201*a* is a space in which plasma is generated, and refers to, for example, a space existing above the lower end of the resonance coil 212 (one-dot chain line in FIG. 1) in the process chamber 201. On the other hand, the modifying space 201*b* is a space in which the wafer 200 is processed with plasma, and refers to a space existing below the lower end of the resonance coil 212.

A susceptor 217 as a substrate mounting part is arranged at the center on the bottom side of the process chamber 201. The upper surface of the susceptor 217 is provided with a substrate mounting surface 217*d* on which the wafer 200 is mounted. A heater 217*b* as a heating mechanism is embedded in the susceptor 217. By supplying electric power to the heater 217*b* through a heater power adjustment mechanism 276, the wafer 200 mounted on the substrate mounting surface 217*d* can be heated to a predetermined temperature within the range of, for example, 25 degrees C. to 1000 degrees C.

The susceptor 217 is electrically insulated from the lower container 211. An impedance adjustment electrode 217*c* is installed inside the susceptor 217. The impedance adjustment electrode 217*c* is grounded through an impedance changing mechanism 275 as an impedance adjustment part. By changing the impedance of the impedance changing mechanism 275 within a predetermined range, it is possible to control the potential (bias voltage) of the wafer 200 during plasma processing via the impedance adjustment electrode 217*c* and the susceptor 217.

A susceptor elevating mechanism 268 for elevating the susceptor 217 is installed below the susceptor 217. The susceptor 217 is installed with three through-holes 217*a*. Three support pins 266 as supports for supporting the wafer 200 are installed on the bottom surface of the lower container 211 so as to correspond to the three through-holes 217*a*, respectively. When the susceptor 217 is lowered, the tips of the three support pins 266 pass through the corresponding through-holes 217*a* and protrude above the substrate mounting surface 217*d* of the susceptor 217. As a result, the wafer 200 can be held from below.

A gas supply head 236 is installed above the process chamber 201, that is, above the upper container 210. The gas supply head 236 includes a cap-shaped lid 233, a gas introduction port 234, a buffer chamber 237, an opening 238, a gas discharge port 239, and a shielding plate 240. The gas supply head 236 is configured to supply a gas into the process chamber 201. The buffer chamber 237 functions as a dispersion space for dispersing a gas introduced from the gas introduction port 234.

The downstream end of a gas supply pipe 232*a* for supplying a nitrogen (N)-containing gas, the downstream end of a gas supply pipe 232*b* for supplying a hydrogen (H)-containing gas, and the like are connected to the gas introduction port 234 so as to joint to each other. On the gas supply pipe 232*a*, an N-containing gas supply source 250*a*, a mass flow controller (MFC) 252*a* as a flow rate control device, and a valve 253*a* as an on-off valve are installed sequentially from the upstream side of the gas flow. On the gas supply pipe 232*b*, an H-containing gas supply source 250*b*, an MFC 252*b*, and a valve 253*b* are installed sequentially from the upstream side of the gas flow. A valve 243*a* and a gas supply pipe 232 are installed on the downstream side of the point where the gas supply pipes 232*a* and 232*b*, and the like join to each other. By opening and closing the valves 253*a*, 253*b* and 243*a*, it is possible to supply the N-containing gas and the H-containing gas into the process container 203 while adjusting the flow rates thereof by the MFCs 252*a* and 252*b*.

In the modifying process to be described later, the wafer 200 having a nitrogen-containing film (hereinafter simply referred to as SiN film) and an oxygen-containing film (hereinafter simply referred to as SiO film) formed on the surface of a silicon (Si) base is processed. It is assumed that a native oxide film (SiON film) exists on the surface of the nitrogen-containing film of the wafer 200.

An N-containing gas supply system is mainly configured by the gas supply pipe 232*a*, the valve 253*a*, the MFC 252*a*, and the N-containing gas supply source 250*a*. An H-containing gas supply system is mainly configured by the gas supply pipe 232*b*, the valve 253*b*, the MFC 252*b*, and the H-containing gas supply source 250*b*.

The modifying apparatus 100 further includes a plurality of gas supply systems (not shown) configured to supply various gases used in the modifying process, in addition to the N-containing gas supply system and the H-containing gas supply system. Like the N-containing gas supply system and the H-containing gas supply system, each gas supply system includes a gas supply pipe, a valve, an MFC and a gas supply source.

The gas supply head 236 (the lid 233, the gas introduction port 234, the buffer chamber 237, the opening 238, the gas discharge port 239, and the shielding plate 240), the gas supply pipe 232 and the valve 243*a* may be included in each gas supply system.

An exhaust port 235 for exhausting the inside of the process chamber 201 installed in a sidewall of the lower container 211. An upstream end of an exhaust pipe 231 is connected to the exhaust port 235. On the exhaust pipe 231, an APC (Auto Pressure Controller) valve 242 as a pressure regulator (pressure regulation part), a valve 243*b*, and a vacuum pump 246 as a vacuum-exhaust device are installed sequentially from the upstream side. An exhaust system is mainly configured by the exhaust port 235, the exhaust pipe 231, the APC valve 242, and the valve 243*b*. The vacuum pump 246 may be included in the exhaust system.

A spiral resonance coil 212 is installed on the outer periphery of the process chamber 201, that is, on the outside of the side wall of the upper container 210 so as to surround the process container 203. An RF (Radio Frequency) sensor 272, a high-frequency power source 273 and a frequency matcher (frequency control part) 274 are connected to the resonance coil 212. A shielding plate 223 is installed on the outer peripheral side of the resonance coil 212.

The high-frequency power source 273 is configured to supply high-frequency power (RF power) to the resonance coil 212. The RF sensor 272 is configured to monitor information on the traveling wave and reflected wave of the high-frequency power supplied from the high-frequency power source 273. The frequency matcher 274 is configured to match the frequency of the high-frequency power outputted from the high-frequency power source 273 based on the reflected wave information monitored by the RF sensor 272 so as to minimize the reflected wave.

Both ends of the resonance coil 212 are electrically grounded. One end of the resonance coil 212 is grounded through a movable tap 213. The other end of the resonance coil 212 is grounded through a fixed ground 214. A movable tap 215 is installed between these ends of the resonance coil 212 so as to arbitrarily set the position at which electric power is supplied from the high-frequency power source 273.

A plasma generation part is mainly configured by the resonance coil 212, the RF sensor 272, and the frequency matcher 274. The high-frequency power source 273 and the shielding plate 223 may be included in the plasma generation part.

The operation of the plasma generation part and the properties of the generated plasma will be supplemented with reference to FIG. 2.

The resonance coil 212 is configured to function as a high-frequency inductively coupled plasma (ICP) electrode. The resonance coil 212 forms a standing wave of a predetermined wavelength, and the winding diameter, winding pitch, number of windings, etc. of the resonance coil 212 are set so that the resonance coil 212 can resonate in a full wavelength mode. For example, the electrical length of the resonance coil 212, that is, the electrode length between the grounds is adjusted so as to be an integral multiple of the wavelength of the high-frequency power supplied from the high-frequency power source 273.

The frequency matcher 274 receives a voltage signal related to the reflected wave power from the RF sensor 272, and performs a correction control to increase or decrease the frequency (oscillation frequency) of the high-frequency power outputted by the high-frequency power source 273 so that the reflected wave power can be minimized.

With the configuration described above, the inductive plasma excited in the plasma generation space 201*a* has a good quality with little capacitive coupling with the inner wall of the process chamber 201, the susceptor 217, and the like. In the plasma generation space 201*a*, there is generated plasma having an extremely low electrical potential and having a doughnut shape in a plan view.

Figure 3:
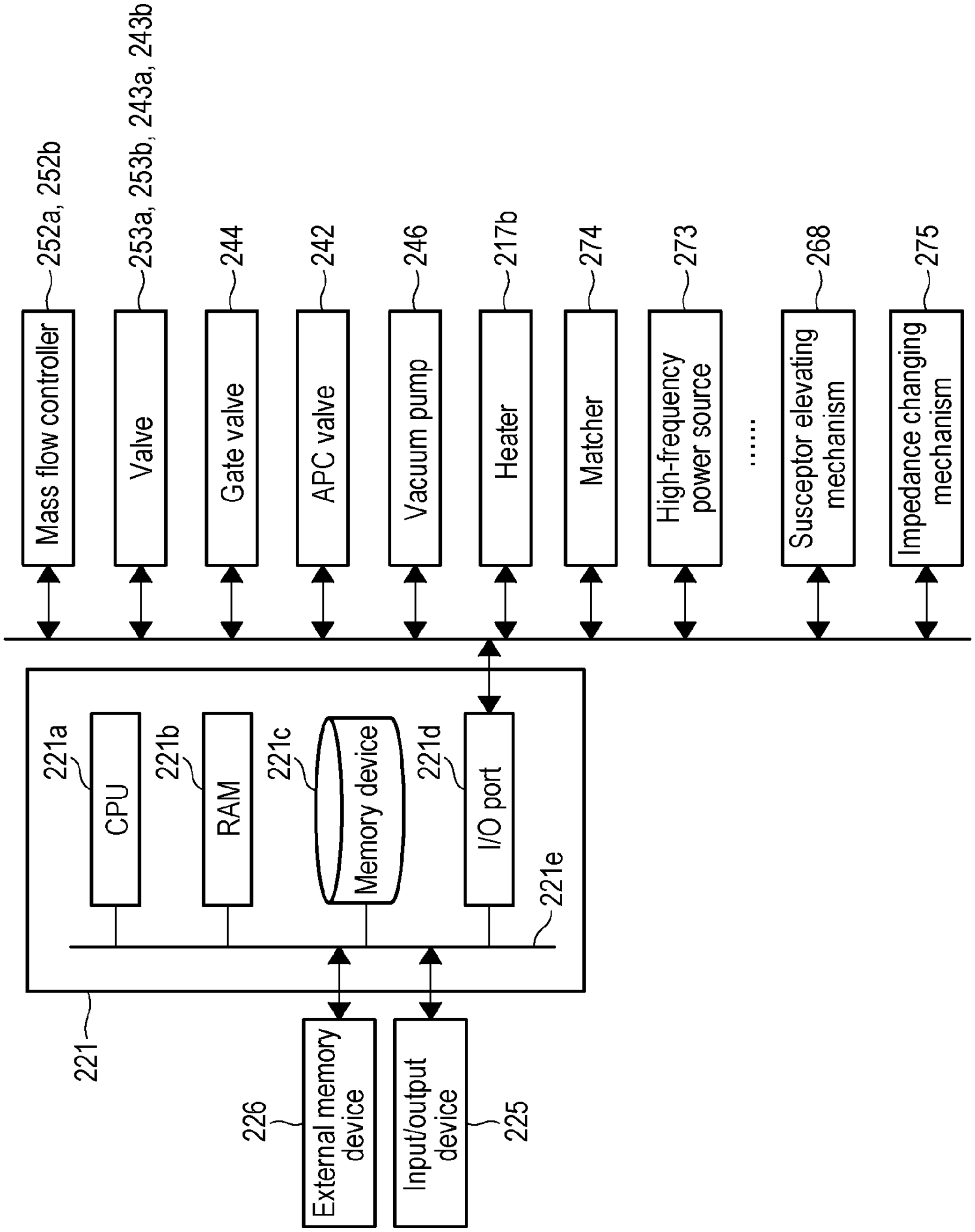
FIG. 3 is a schematic configuration diagram of a controller of the modifying apparatus, in which a control system of the controller is shown in a block diagram.

As shown in FIG. 3, the controller 221 as a control part is configured as a computer that includes a CPU (Central Processing Unit) 221*a*, a RAM (Random Access Memory) 221*b*, a memory device 221*c* and an I/O port 221*d*. The RAM 221*b*, the memory device 221*c* and the I/O port 221*d* are configured to exchange data with the CPU 221*a* via an internal bus 221*e*. For example, a touch panel, a mouse, a keyboard, an operation terminal, or the like as an input/output device 225 may be connected to the controller 221. For example, a display, or the like as a display part may be connected to the controller 221.

The memory device 221*c* is composed of, for example, a flash memory, an HDD (Hard Disk Drive), a CD-ROM, or the like. The memory device 221*c* readably stores a control program for controlling the operation of the modifying apparatus 100, a process recipe describing procedures and conditions for substrate processing, and the like. The process recipe is a combination that causes the controller 221 to execute the respective procedures in a substrate processing process, which will be described later, to obtain a predetermined result. The process recipe functions as a program. The RAM 221*b* is configured as a memory area (work area) in which the programs and data read by the CPU 221*a* are temporarily stored.

The I/O port 221*d* is connected to the MFCs 252*a* and 252*b*, the valves 253*a* and 253*b*, 243*a* and 243*b*, the gate valve 244, the APC valve 242, the vacuum pump 246, the heater 217*b*, the RF sensor 272, the high-frequency power source 273, the frequency matcher 274, the susceptor elevating mechanism 268, the impedance changing mechanism 275, and the like.

The CPU 221*a* is configured to read the control program from the memory device 221*c* and execute the same, and is configured to read the process recipe from the memory device 221*c* in response to an input of an operation command from the input/output device 225 or the like. Then, as shown in FIG. 1, the CPU 221*a* is configured to, according to the contents of the process recipe thus read, control the operation of adjusting the opening degree of the APC valve 242, the opening/closing operation of the valve 243*b* and the start/stop of the vacuum pump 246 through the I/O port 221*d* and a signal line A, control the elevating operation of the susceptor elevating mechanism 268 through a signal line B, control the operation of adjusting the electric power supplied to the heater 217*b* based on the temperature sensor by the heater power adjustment mechanism 276 (temperature adjustment operation) and the impedance value adjustment operation by the impedance changing mechanism 275 through a signal line C, control the opening/closing operation of the gate valve 244 through a signal line D, control the operations of the RF sensor 272, the frequency matcher 274 and the high-frequency power source 273 through a signal line E, and control the flow rate adjustment operation for various gases by the MFCs 252*a* and 252*b* and the opening/closing operation of the valves 253*a*, 253*b* and 243*a* through a signal line F.

(2) Substrate Processing Process

An example of a substrate processing sequence as a process of manufacturing a semiconductor device using the above-described modifying apparatus 100 will be described. In the following description, the operation of each component that constitutes the modifying apparatus 100 is controlled by the controller 221.

The substrate processing sequence of the present embodiment includes:

(a) preparing a wafer 200 having a nitrogen-containing film and an oxygen-containing film on a surface thereof; and (b) modifying a surface of the nitrogen-containing film to be nitrided by supplying a nitrogen-containing active species and a hydrogen-containing active species to the wafer 200.

The term "wafer" used herein may refer to "a wafer itself" or "a stacked body of a wafer and a predetermined layer or film formed on the surface of the wafer." The phrase "a surface of a wafer" used herein may refer to "a surface of a wafer itself" or "a surface of a predetermined layer or the like formed on a wafer." The expression "a predetermined layer is formed on a wafer" used herein may mean that "a predetermined layer is directly formed on a surface of a wafer itself" or that "a predetermined layer is formed on a layer or the like formed on a wafer." The term "substrate" used herein may be synonymous with the term "wafer."

In the present embodiment, a processing sequence will be described in which as shown in FIGS. 4A to 4E as an example, a titanium nitride (TiN) film is selectively formed only on a SiN film in a wafer 200 having a SiN film and a SiO film formed on the surface of a Si substrate. This substrate processing sequence includes, as main processes, a wafer-preparing process, a surface-modifying process, a film-forming inhibitor bonding process, a film-forming process, and a film-forming inhibitor removing process.

As shown in FIG. 4A, the wafer-preparing process is a process of preparing a wafer 200 having a SiN film and a SiO film formed on the surface of a Si substrate. It is assumed that a native oxide film (SiON film) exists on the surface of the SiN film of the wafer 200. As shown in FIG. 4B, the surface-modifying process is a process in which the surface of the SiN film formed on the surface of the wafer 200 is modified to be nitrided, and the surface of the SiO film formed on the surface of the wafer 200 is modified to be terminated with hydroxyl groups (OH). As shown in FIG. 4C, the film-forming inhibitor bonding process is a process of selectively bonding the film-forming inhibitor only to the surface of the SiO film. As shown in FIG. 4D, the film-forming process is a process of selectively forming a TiN film only on the surface of the SiN film. As shown in FIG. 4E, the film-forming inhibitor removing process is a process of removing the film-forming inhibitor bonded to the surface of the SiO film. This substrate processing sequence will be described in detail below.

(Wafer Loading (Wafer-Preparing))

In a state in which the susceptor 217 is lowered to a predetermined transfer position, the gate valve 244 is opened and the wafer 200 to be processed is transferred into the process container 203 by a transfer robot (not shown). The wafer 200 loaded into the process container 203 is horizontally supported on the three support pins 266 protruding upward from the substrate mounting surface 217*d* of the susceptor 217. After the loading of the wafer 200 into the process container 203 is completed, the arm of the transfer robot is withdrawn from the process container 203 and the gate valve 244 is closed. Thereafter, the susceptor 217 is raised to a predetermined processing position, and the wafer 200 to be processed is delivered from the support pins 266 onto the susceptor 217.

(Pressure Regulation and Temperature Adjustment)

Subsequently, the inside of the process container 203 is vacuum-exhausted by the vacuum pump 246 so as to have a desired processing pressure. The pressure inside the process container 203 is measured by a pressure sensor, and the APC valve 242 is feedback-controlled based on this measured pressure information. Further, the wafer 200 is heated by the heater 217*b* so as to reach a desired processing temperature. After the inside of the process container 203 reaches the desired processing pressure and the temperature of the wafer 200 reaches the desired processing temperature and becomes stable, the surface-modifying process, which will be described later, is started.

(Surface-Modifying Process)

By supplying an N-containing gas and an H-containing gas as modifying gases into the process container 203 and plasma-exciting them, at least one selected from the group of an active species of N and an active species of an NH group is generated as an N-containing active species, and an active species of H is generated as an H-containing active species.

Specifically, the valves 253*a* and 253*b* are opened to supply the N-containing gas and the H-containing gas into the process chamber 201 through the gas introduction port 234, the buffer chamber 237, and the gas discharge port 239 while mixing the N-containing gas and the H-containing gas and adjusting the flow rates thereof by the MFCs 252*a* and 252*b*. At this time, high-frequency power is supplied from the high-frequency power source 273 to the resonance coil 212. As a result, inductive plasma having a doughnut shape in a plan view is excited at a height position corresponding to the electrical midpoint of the resonance coil 212 in the plasma generation space 201*a*.

As the N-containing gas, for example, a nitrogen ($N_2$) gas, or a hydrogen nitride-based gas such as an ammonia ($NH_3$) gas, a diazene ($N_2H_2$) gas, a hydrazine ($N_2H_4$) gas, an $N_3H_8$ gas, or the like may be used. One or more of these gases may be used as the N-containing gas. When using the hydrogen nitride-based gas as the N-containing gas, it is desirable that a gas other than the hydrogen nitride-based gas is used as the H-containing gas.

As the H-containing gas, for example, a hydrogen ($H_2$) gas, a deuterium ($D_2$) gas, a water vapor ($H_2O$ gas), the above-described hydrogen nitride-based gas, or the like may be used. One or more of these may be used as the hydrogen-containing gas.

The N-containing gas and the H-containing gas contained in the mixed gas are activated (excited) and reacted by excitation of the inductive plasma or the like. An active species containing N and an active species containing H are generated in the process container 203.

For example, when the $N_2$ gas is used as the N-containing gas, the active species of N include at least one selected from the group of excited N atoms, excited $N_2$ molecules, and ionized N atoms. In the following description and drawings, the active species of N are collectively referred to as "N*". The active species of NH groups include excited NH groups. As the active species containing N, at least one selected from the group of the active species of N and the active species of NH groups acts, as a nitriding species as described later.

Further, for example, when the $H_2$ gas is used as the H-containing gas, the active species of H include at least one selected from the group of excited H atoms, excited $H_2$ molecules, and ionized H atoms. In the following description and drawings, the active species of H are collectively referred to as "H*".

Figures 5A, 5B:
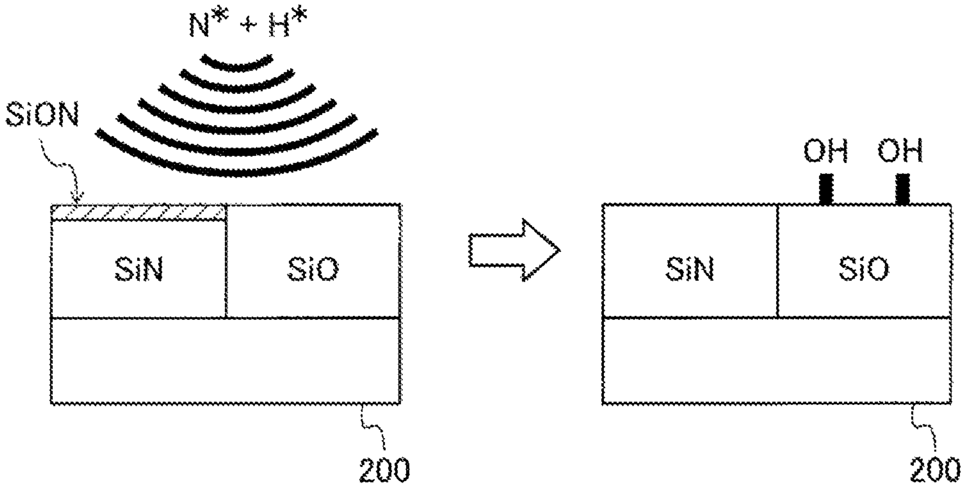
FIGS. 5A and 5B are diagrams showing details of the surface-modifying process.

Then, as shown in FIG. 5A, the generated N-containing active species and H-containing active species are supplied to the wafer 200. As a result, as shown in FIG. 5B, the surface of the SiN film formed on the surface of the wafer 200 is modified to be nitrided, and the surface of the SiO film formed on the surface of the wafer 200 is modified to be terminated with hydroxyl (OH) groups.

Figures 6A, 6B, 6C:
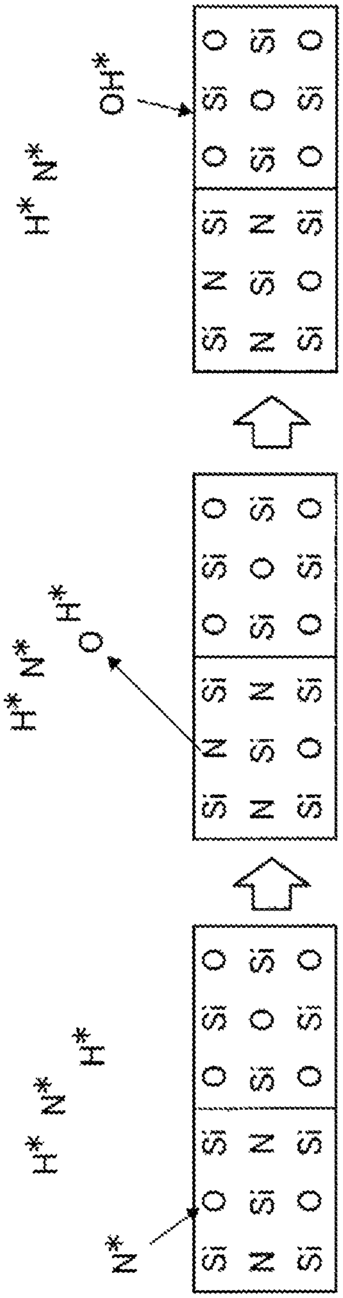
FIGS. 6A to 6C are diagrams for explaining a mechanism of the surface-modifying process.

The mechanism at this time is as shown in FIGS. 6A to 6C. First, as shown in FIG. 6A, when N* and H* are supplied to a wafer 200 having a SiN film and a SiO film on the surface of a Si substrate, N* acts as a nitriding species and nitrides the native oxide film (SiON film) on the surface of the SiN film. Next, as shown in FIG. 6B, oxygen (O) is released from the SiON film by the nitriding of the SiON film, and the released O is bonded with H* to generate OH radicals (in the following description and drawings, the active species of OH are collectively referred to as "OH*")), which are the active species of OH. Next, as shown in FIG. 6C, the generated OH* is supplied to the surface of the SiO film to re-oxidize the SiO film and/or form OH termination of the surface of the SiO film. In addition to or instead of the mechanism described above, re-oxidation of the SiO film and/or OH termination of the surface of the SiO film may be performed. That is, when N* and H* are supplied to the wafer 200, N* acts as a nitriding species to temporarily nitride the surface of the SiO film. At this time, O is released (desorbed) from the SiO film, and the released O is bonded with H* to generate OH*. OH* generated in this manner is supplied to the surface of the SiO film to re-oxidize the SiO film and/or form OH termination of the surface of the SiO film. Therefore, when N* and H* are supplied to the SiO film, the nitriding of the SiO film is suppressed and the termination of the surface of the SiO film with OH is promoted, as compared with the case where H* is not contained.

The OH termination of the surface of the SiO film formed on the surface of the wafer 200 may also be generated by the mechanism shown in FIGS. 7A and 7B in addition to the mechanism described above. As shown in FIG. 7A, when H* is supplied to the SiO film formed on the surface of the wafer 200, as shown in FIG. 7B, the bond between Si and O is cut at the OH-terminated portion of the surface of the SiO film due to the reduction action of H*. The cut O and H* are bonded to each other so that the surface of the SiO film is terminated with OH.

As described above, the wafer 200 having the SiN film and the SiO film on the surface of the Si substrate is subjected to the surface-modifying process by supplying the mixed gas of the N-containing gas and the H-containing gas, whereby the nitriding of the SiN film and the OH termination of the SiO film can be performed simultaneously in one process.

An example of processing conditions in this process is described as follows.

The processing pressure is 1 to 100 Pa, more specifically 20 to 30 Pa. If the processing pressure is lower than 1 Pa, the production rate of nitriding, reduction and OH termination may be decreased, and a practical production rate may not be obtained. On the other hand, if the processing pressure is higher than 100 Pa, there may be a possibility that plasma is not generated.

Each gas supply time is 1 to 10 minutes, specifically 2 to 3 minutes. If the gas supply time is shorter than 1 minute, there may be a possibility that the nitriding of the SiON film on the surface of the SiN film is incomplete. If the gas supply time is longer than 10 minutes, there may be possibility that the SiO film is substantially nitrided.

The processing temperature is room temperature to 700 degrees C., specifically 200 to 400 degrees C. The upper limit needs to be a temperature at which the OH termination is not desorbed from the surface of the SiO film. The processing temperature depends on compatibility with the film-forming inhibitor described below, and is desirable as low as possible. However, if the temperature is too low, the nitriding rate may decrease. Therefore, it is desirable to select the processing temperature in consideration of the compatibility with the film-forming inhibitor and the relationship with the nitriding rate. Further, it is desirable that the nitriding is performed at the room temperature or higher, although it is performed under plasma. If the processing temperature is 200 degrees C. or higher, more stable plasma can be generated.

The high-frequency power depends on the surface area of the wafer 200 and is, for example, 100 to 7900 W, specifically 500 to 2000 W.

The supply flow rate of the mixed gas of the N-containing gas and the H-containing gas depends on the processing pressure and is, for example, 0.2 to 1.0 slm, specifically 0.4 to 0.6 slm.

The concentration of the H-containing gas in the mixed gas is 10 to 80%, specifically 20 to 60%. By adding not only the N-containing gas but also the H-containing gas to the mixed gas, only the SiN film on the surface of the wafer 200 can be nitrided and the SiO film can be terminated with OH. That is, the supply of H* can prevent the surface of the SiO film from being nitrided. The notation of a numerical range such as "1 to 100 Pa" in this specification means "1 Pa or more and 100 Pa or less". The same applies to other numerical ranges.

As described above, after performing the surface-modifying process, the supply of the N-containing gas and the H-containing gas into the process container 203 is stopped, and the supply of the high-frequency power to the resonance coil 212 is stopped. Then, an inert gas as a purge gas is supplied into the process container 203 and exhausted from the exhaust pipe 231. As a result, the inside of the process container 203 is purged, and the gas and reaction by-products remaining in the process container 203 are removed from the inside of the process container 203.

As the inert gas, for example, a $N_2$ gas, or a rare gas such as an argon (Ar) gas, a helium (He) gas, a neon (Ne) gas, or a xenon (Xe) gas may be used. One or more of these gases may be used as the inert gas. This point also applies to each step described later.

(Film-Forming Inhibitor Bonding Process)

As shown in FIG. 8, the wafer 200 subjected to the surface-modifying process is transferred from the modifying apparatus 100 to a film-forming apparatus 300 via a vacuum transfer path 400 in a vacuum state in order to perform a film-forming inhibitor bonding process on the wafer 200. Since the wafer 200 is transferred through the vacuum transfer path 400, the surface of the wafer 200 is not exposed to the atmosphere and can be prevented from being oxidized. A system including the modifying apparatus 100 and the film-forming apparatus 300 is called a substrate processing system 500.

A film-forming inhibitor-containing gas is supplied to the wafer 200 transferred into the process container of the film-forming apparatus 300. The film-forming inhibitor-containing gas is a gas containing a substance which is selectively bonded to OH groups to inhibit the bonding of a precursor used in the film-forming process described below. As the film-forming inhibitor-containing gas, for example, a compound having a structure in which an amino group is directly bonded to Si or a compound having a structure in which an amino group and an alkyl group are directly bonded to Si may be used. For example, it may be possible to use (dimethylamino)trimethylsilane ($(CH_3)_2NSi(CH_3)_3$, abbreviation: DMATMS), (diethylamino)triethylsilane ($(C_2H_5)_2NSi(C_2H_5)_3$, abbreviation: DEATES), (dimethylamino)triethylsilane ($(CH_3)_2NSi(C_2H_5)_3$, abbreviation: DMATES), (diethylamino)trimethylsilane ($(C_2H_5)_2NSi(CH_3)_3$, abbreviation: DEATMS), (dipropylamino)trimethylsilane ($(C_3H_7)_2NSi(CH_3)_3$, abbreviation: DPATMS), (dibutylamino)trimethylsilane ($(C_4H_9)_2NSi(CH_3)_3$, abbreviation: DBATMS), (trimethylsilyl)amine ($(CH_3)_3SiNH_2$, abbreviation: TMSA), (triethylsilyl)amine ($(C_2H_5)_3SiNH_2$, abbreviation: TESA), (dimethylamino)silane ($(CH_3)_2NSiH_3$, abbreviation: DMAS), (diethylamino)silane ($(C_2H_5)_2NSiH_3$, abbreviation: DEAS), (dipropylamino)silane ($(C_3H_7)_2NSiH_3$, abbreviation: DPAS), (dibutylamino) silane ($(C_4H_9)_2NSiH_3$, abbreviation: DBAS), and the like. It may also be possible to use, for example, bis(dimethylamino)dimethylsilane ($[(CH_3)_2N]_2Si(CH_3)_2$, abbreviation: BDMADMS), bis(diethylamino)diethylsilane ($[(C_2H_5)_2N]_2Si(C_2H_5)_2$, abbreviation: BDEADES), bis(dimethylamino)diethylsilane ($[(CH_3)_2N]_2Si(C_2H_5)_2$, abbreviation: BDMADES), bis(diethylamino)dimethylsilane ($[(C_2H_5)_2N]_2Si(CH_3)_2$, abbreviation: BDEADMS), bis(dimethylamino)silane ($[(CH_3)_2N]_2SiH_2$, abbreviation: BDMAS), bis(diethylamino)silane ($[(C_2H_5)_2N]_2SiH_2$, abbreviation: BDEAS), bis(dimethylaminodimethylsilyl)ethane ($[(CH_3)_2N(CH_3)_2Si]_2C_2H_6$, abbreviation: BDMADMSE), bis(dipropylamino)silane ($[(C_3H_7)_2N]_2SiH_2$, abbreviation: BDPAS), bis(dibutylamino)silane ($[(C_4H_9)_2N]_2SiH_2$, abbreviation: BDBAS), bis(dipropylamino)dimethylsilane ($[(C_3H_7)_2N]_2Si(CH_3)_2$, abbreviation: BDPADMS), bis (dipropylamino)diethylsilane ($[(C_3H_7)_2N]_2Si(C_2H_5)_2$, abbreviation: BDPADES), (dimethylsilyl)diamine ($(CH_3)_2Si(NH_2)_2$, abbreviation: DMSDA), (diethylsilyl)diamine ($(C_2H_5)_2Si(NH_2)_2$, abbreviation: DESDA), (dipropylsilyl)diamine ($(C_3H_7)_2Si(NH_2)_2$, abbreviation: DESDA), bis(dimethylaminodimethylsilyl)methane ($[(CH_3)_2N(CH_3)_2Si]_2CH_2$, abbreviation: BDMADMSM), bis(dimethylamino)tetramethyldisilane ($[(CH_3)_2N]_2(CH_3)_4Si_2$, abbreviation: BDMATMDS), and the like. One or more of these substances may be used as the film-forming inhibitor-containing gas.

Specifically, the valve of the film-forming inhibitor-containing gas supply system of the film-forming apparatus is opened to supply the film-forming inhibitor-containing gas into the process container while adjusting the flow rate thereof by the MFC.

By supplying the film-forming inhibitor-containing gas to the wafer 200 in this way, as shown in FIG. 4C, an organic ligand (also referred to as a film-forming inhibitor) contained in the film-forming inhibitor-containing gas (the organic ligand may be at least a part of the molecular structure of molecules constituting the film-forming inhibitor) is bonded to the surfaces of an Si layer and an $SiO_2$ layer only on the SiO film having an OH-terminated surface on the surface of the wafer 200, thereby organically terminating the surface of the SiO film. In this way, a film-forming inhibition layer composed of organic ligands bonded to the SiO film is formed.

Thereafter, the supply of the film-forming inhibitor-containing gas into the process container is stopped, and the inert gas as a purge gas is supplied into the process container and exhausted from the process container. As a result, the inside of the process container is purged, and the gas and reaction by-products remaining in the process container are removed from the inside of the process container.

By performing the film-forming inhibitor bonding process one or more times (a predetermined number of times (n times)), a required amount of film-forming inhibitor is bonded to only the SiO film having an OH-terminated surface on the surface of the wafer 200. It is desirable that the above process is repeated multiple times.

(Film-Forming Process)

Next, a case of selectively forming a titanium nitride (TiN) film only on the SiN film on the surface of the wafer 200 will be described as an example of the film-forming process.

First, a gas containing titanium (Ti) is supplied to the wafer 200 in the process container of the film-forming apparatus. Specifically, the valve of the Ti-containing gas supply system is opened to supply a Ti-containing gas into the process chamber while adjusting the flow rate thereof by the MFC.

As a result, the Ti-containing gas is supplied to the wafer 200, and the Ti precursor is bonded only to the SiN film, to which the film-forming inhibitor is not substantially bonded, on the surface of the wafer 200, whereby a titanium (Ti)-containing film is formed. Examples of the Ti-containing gas include a halogenated Ti-containing gas such as a titanium tetrachloride (TiCl4) gas, a titanium tetraiodide ($TiI_4$) gas or the like, an organic Ti-containing gas such as tetrakisethylmethylaminotitanium ($Ti[N(CH_3)C_2H_5]_4$), tetrakisdiethylaminotitanium ($Ti[N(C_2H_5)_2]_4$), tetrakisdimethylaminotitanium ($Ti[N(CH_3)_2]_4$), $Ti(O\text{-}tBu)_4$, $Ti(MMP)_4$, trisdimethylaminocyclopentadienyltitanium ($(C_5H_5)Ti[N(CH_3)_2]_3$) or the like, and so forth. One or more of these gases may be used as the Ti-containing gas.

Thereafter, the supply of the Ti-containing gas into the process container is stopped, and the inert gas as a purge gas is supplied into the process container and exhausted from the process container. As a result, the inside of the process container is purged, and the gas and reaction by-products remaining in the process container are removed from the inside of the process container.

Next, a nitriding gas containing N is supplied to the wafer 200 in the process container. Specifically, the valve of the nitriding gas supply system is opened to supply a nitriding gas into the process chamber while adjusting the flow rate thereof by the MFC. As a result, the nitriding gas is supplied to the wafer 200 and causes a substitution reaction with at least a part of the Ti-containing film on the SiN layer on the surface of the wafer 200. During the substitution reaction, Ti contained in the Ti-containing film and N contained in the nitriding gas are bonded to each other, thereby forming a TiN film containing Ti and N on the SiN layer on the wafer 200 as shown in FIG. 4D. Substantially no TiN film is formed on the SiO film, to which the film-forming inhibitor is bonded, on the surface of the wafer 200.

As the nitriding gas, for example, a hydrogen nitride gas such as an ammonia ($NH_3$) gas, a diazene ($N_2H_2$) gas, a hydrazine ($N_2H_4$) gas, an $N_3H_8$ gas, or the like may be used. One or more of these gases may be used as the nitriding gas.

Thereafter, the supply of the nitriding gas into the process chamber is stopped, and the inert gas as a purge gas is supplied into the process container and exhausted from the process container. As a result, the inside of the process container is purged, and the gas and reaction by-products remaining in the process container are removed from the inside of the process container.

By performing the above-described film-forming process one or more times (predetermined number of times (n times)), a TiN film having a desired thickness is formed only on the SiN film, to which the film-forming inhibitor is not bonded, on the surface of the wafer 200. It is desirable that the above process is repeated multiple times.

(Film-Forming Inhibitor Removing Process)

Thereafter, a processing such as heat treatment or the like is performed on the wafer 200. As a result, it is possible to desorb or disable at least a part of the film-forming inhibitor remaining on the surface. Disabling the film-forming inhibitor means changing the molecular structure of the molecules constituting the film-forming inhibitor, the arrangement structure of atoms, etc., so that the film-forming agent can be adsorbed to the film surface or can react with the film surface.

As a result, as shown in FIG. 4E, the film-forming inhibitor bonded only to the SiO film on the surface of the wafer 200 can be removed.

(After-Purge and Atmospheric Pressure Restoration)

Thereafter, the atmosphere inside the process container 203 is replaced with an inert gas, and the pressure inside the process container is returned to the atmospheric pressure.

(Wafer Unloading)

Subsequently, the wafer 200 is appropriately unloaded from the process container. In this way, the substrate processing process according to the present embodiment is finished. It is desirable that the film-forming inhibitor bonding process (modifying) step, the film-forming process step, and the film-forming inhibitor removing process (heat treatment) step described above are performed in the same process chamber (in-situ). Thus, the modifying step, the film-forming process step, and the heat treatment step can be performed without exposing the wafer 200 to the atmosphere, that is, while maintaining the surface of the wafer 200 in a clean state, so that it is possible to perform selective growth. That is, by performing these steps in the same process chamber, the selective growth can be performed with high selectivity. Furthermore, in the above-described embodiment, the surface-modifying process is performed using the modifying apparatus 100. However, this process may be performed in the film-forming apparatus 300. According to this method, the surface-modifying process step, the film-forming inhibitor bonding process (modifying) step, the film-forming process step, and the film-forming inhibitor removing process (heat treatment) step can be performed in the same process chamber (in-situ).

(3) Effects of the Present Embodiment

As described above, in the first embodiment, the mixed gas of the N-containing gas and the H-containing gas is supplied to the wafer 200 having the SiN film and the SiO film on the surface of the Si substrate to perform the surface-modifying process, whereby the surface nitriding of the SiN film and the OH termination of the SiO film can be simultaneously performed in one step. In addition, unlike the conventional wet etching process (DHF (Dilute HF) process) using hydrofluoric acid (HF), the surface-modifying process does not use fluorine. Therefore, it is possible to modify the surface of the film without leaving fluorine behind.

In the present embodiment, the nitriding of the surface of the SiN film means that the SiN film is modified to increase the nitrogen concentration of the surface of the SiN film by a first increment amount, and the SiO film is modified so as to increase the nitrogen concentration of the surface of the SiO film by a second increment amount smaller than the first increment amount, or so as not to increase the nitrogen concentration.

In the present embodiment, when an oxygen- and nitrogen-containing layer (SiON film) is formed on the surface of the SiN film, the SiON film can be nitrided.

Further, in the surface-modifying process, O atoms contained in the SiO film is caused to react with an active species containing H to generate OH radicals and terminate the surface of the SiO film with OH. Therefore, in the subsequent film-forming inhibitor bonding process, the film-forming inhibitor can be selectively bonded only to the surface of the SiO film.

Further, by performing the film-forming inhibitor bonding process after the surface-modifying process, it is possible to selectively form a film on the SiN film except for the SiO film.

In addition, the N-containing active species and the H-containing active species supplied in the surface-modifying process are generated by plasma-exciting the N- and H-containing gas. Therefore, this can be easily realized in the modifying apparatus 100 capable of performing the plasma processing as described above.

In addition, the gas containing N and H supplied in the surface-modifying process may be at least one selected from the group of the mixed gas of the N-containing gas and the gas containing a chemical bond of N and H (N—H bond). Even in this case, the same effects as those of the substrate processing sequence described above can be obtained.

In addition, it desirable that the percentage of H in the mixed gas of the N-containing gas and the H-containing gas (i.e., the ratio of the number of H atoms to the total number of N and H atoms in the mixed gas) is 10% or more and 80% or less, more specifically 20% or more and 60% or less. If the percentage of H is less than 10%, the extent of OH termination on the surface of the SiO film on the surface of the wafer 200 is lowered. Moreover, if the percentage of H exceeds 80%, the extent of nitriding of the surface of the SiN film on the surface of the wafer 200 decreases. Therefore, by setting the percentage of H to 10% or more and 80% or less, both the nitriding of the SiN film on the surface of the wafer 200 and the OH termination of the SiO film can be made compatible. If the percentage of H is 20% or more and 60% or less, the compatibility can be further improved.

By adjusting the percentages of the N-containing gas and the H-containing gas in the mixed gas supplied to the wafer 200 through the use of such characteristics, the surface of the SiO film may be modified to a desired degree of nitriding, and the surface of the SiO film may be terminated with OH.

Further, the gas containing a chemical bond of N and H may be, for example, at least one selected from the group of hydrogen nitride-based gases such as an ammonia (NH) gas, a hydrazine (NH) gas, and a diazene (NH) gas. Even in this case, the same effects as those of the substrate processing sequence described above can be obtained. However, in terms of being able to adjust the percentages of N and H contained in the mixed gas, it is more desirable to use the mixed gas of the N-containing gas and the H-containing gas.

In addition, the process of forming OH termination on the surface of the SiO film by supplying any of the active species containing N and the active species containing H to the wafer 200 having the SiO film on the surface thereof and the process of forming the film-forming inhibition layer on the OH termination are provided, whereby a desired film can be only on the surface of the SiN film in the film-forming process after the film-forming inhibitor bonding process.

Further, the process of modifying the SiON film on the SiN film by supplying the active species containing N and the active species containing H to the wafer 200 having the SiN film on which the SiON film exists and the process of forming a film on the surface of the modified SiN film are provided, whereby a desired film can be selectively formed only on the surface of the SiN film.

Further, when the film-forming inhibition layer is formed on the surface of the first film of the wafer 200 having the first film (SiO film) and the second film (SiN film) on the surface thereof to thereby form a film on the surface of the second film not provided with the film-forming inhibition layer, the process of modifying the second film so as to increase the nitrogen concentration of the surface of the second film by supplying the active species containing N and the active species containing H to the wafer 200 and forming OH groups on the first film and the process of forming the film-forming inhibition layer by allowing at least a part of molecular structures of molecules constituting the film-forming inhibitor to be adsorbed to OH groups are provided, whereby a desired film can be selectively formed only on the surface of the SiN film in the film-forming process after the film-forming inhibitor bonding process.

Second Embodiment

In the first embodiment, there has been described the example where in the surface-modifying process of the substrate processing sequence, the active species containing N and the active species containing H are supplied as the modifying gas. In the present embodiment, there will be described an example where only the active species containing H is supplied as the modifying gas.

The hardware configuration of the modifying apparatus 100 according to the present embodiment is the same as that of the first embodiment. Therefore, the description thereof will be omitted.

(1) Substrate Processing Process

Since processes other than the surface-modifying process in the substrate processing sequence of the present embodiment are the same as those of the first embodiment. Therefore, the description thereof will be omitted.

(Surface-Modifying Process)

In the surface-modifying process of the present embodiment, an H-containing gas that does not contain N and O or essentially does not contain N and O (hereinafter, simply referred to as "N- and O-free H-containing gas") is supplied as a modifying gas into the process container 203 and is excited by plasma, thereby generating H* as an H-containing active species. As the N- and O-free H-containing gas in the present embodiment, for example, an $H_2$ gas, a $D_2$ gas, or the like may be used. One or more of these gases may be used as the H-containing gas.

Specifically, the valve **253*b* is opened to supply the N- and O-free H-containing gas into the process chamber 201 through the gas introduction port 234, the buffer chamber 237, and the gas discharge port 239 while adjusting the flow rate thereof by the MFC 252*b*. At this time, high-frequency power is supplied from the high-frequency power source 273 to the resonance coil 212. As a result, inductive plasma having a doughnut shape in a plan view is excited at a height position corresponding to the electrical midpoint of the resonance coil 212 in the plasma generation space 201*a***.

The H-containing gas is activated (excited) by excitation of the inductive plasma or the like and reacts to generate H* in the process container 203.

Figure 9A:
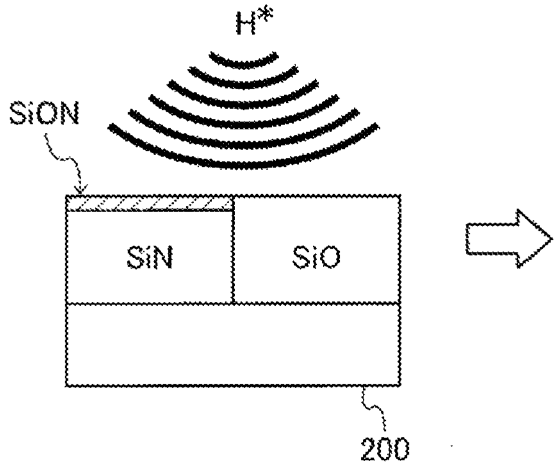
FIGS. 9A and 9B are diagrams showing details of the surface-modifying process.
Figure 9B:
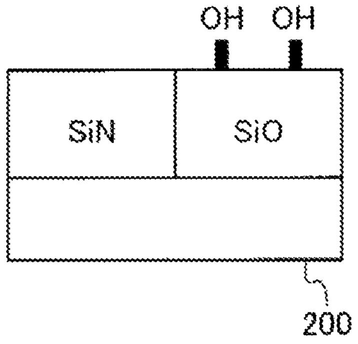

Then, the generated H* is supplied to the wafer 200 as shown in FIG. 9A. As a result, as shown in FIG. 9B, the surface of the SiN film formed on the surface of the wafer 200 is modified so as to be reduced, and the surface of the SiO film formed on the surface of the wafer 200 is modified to be terminated with hydroxyl groups (OH).

Figures 10A, 10B, 10C:
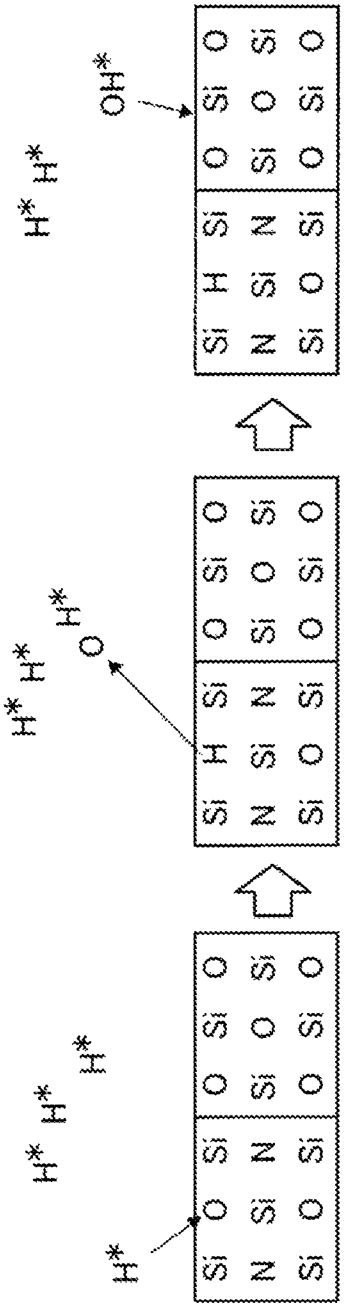
FIGS. 10A to 10C are diagrams for explaining a mechanism of the surface-modifying process.

The mechanism at this time is as shown in FIGS. 10A to 10C. First, as shown in FIG. 10A, when H* is supplied to a wafer 200 having a SiN film and a SiO film on the surface of a Si substrate, H is bonded to a native oxide film (SiON film) on the surface of the SiN film due to the reduction action of H*. Next, as shown in FIG. 10B, oxygen (O) is released from the SiON film by the reduction action of H*, and the released O is bonded to H* to generate OH*. Thus, the SiON film on the surface of the SiN film is reduced to the SiN film by the reduction action of H*. Although H is introduced into the substrate in FIG. 10B, it is not necessarily required to introduce H into the substrate. O may simply be released, and the crystal structure of the substrate surface may be changed based on the release of O. Next, as shown in FIG. 10C, the generated OH* is supplied to the surface of the SiO film to re-oxidize the SiO film and/or form OH termination on the surface of the SiO film. In addition, as in the case of the first embodiment, the supply of H* to the surface of the SiO film also generates OH*, and the supply of OH* causes re-oxidation of the SiO film and/or formation of OH termination of the surface of the SiO film.

The OH termination of the surface of the SiO film formed on the surface of the wafer 200 may also be generated by the mechanism described with reference to FIGS. 7A and 7B in the first embodiment, in addition to the mechanism described above. When H* is supplied to the SiO film formed on the surface of the wafer 200 as shown in FIG. 7A, the bond between Si and O is cut at the SiO-terminated portion of the surface of the SiO film by the reduction action of H* as shown in FIG. 7B. O and H* thus cut are bonded to terminate the surface of the SiO film with OH.

As described above, even when the surface-modifying process is performed by supplying the N- and O-free H-containing gas to the wafer 200 having the SiN film and the SiO film on the surface of the Si substrate and having the SiON film formed on the surface of the SiN film, the reduction of the SiON film to the SiN film and the OH termination of the SiO film can be simultaneously performed in one step.

After the surface-modifying process is performed as described above, the supply of the H-containing gas into the process container 203 is stopped, and the supply of the high-frequency power to the resonance coil 212 is stopped. Then, the inert gas as a purge gas is supplied into the process container 203 and exhausted from the exhaust pipe 231. As a result, the inside of the process container 203 is purged, and the gas and reaction by-products remaining in the process container 203 are removed from the inside of the process container 203.

(2) Effects of the Present Embodiment

As described above, the surface-modifying process is performed by supplying the N- and O-free H-containing gas to the wafer 200 having the SiN film and the SiO film on the surface of the Si substrate and having the SiON film formed on the surface of the SiN film, whereby the reduction of the SiON film to the SiN film and the OH termination of the SiO film can be simultaneously performed in one step. In addition, unlike the conventional DHF process using hydrofluoric acid (HF), the surface-modifying process does not use fluorine. Therefore, it is possible to modify the surface of the film without leaving fluorine behind.

In the present embodiment, the OH termination of the SiO film means that the SiO film is modified so that the OH termination is selectively formed on the surface of the SiO film while the OH termination is not formed on the surface of the SiN film, or the OH termination is formed on the surface of the SiN film at a density less than that of the OH termination formed on the surface of the SiO film.

In the present embodiment, the H-containing gas as the modifying process gas does not contain O or contains essentially no O. Moreover, in the present embodiment, there has been described the example where only the N- and O-free H-containing gas is used. However, the H-containing gas may contain rare gases such as helium, neon, and argon. Even with such a gas, the same effects as in the substrate processing sequence described above can be obtained.

Third Embodiment

In the first embodiment, in the surface-modifying process of the substrate processing sequence, the active species containing N and the active species containing H are supplied as the modifying gas. In the present embodiment, there will be described an example where an active species containing H and O is supplied as a modifying gas.

Since the hardware configuration of the modifying apparatus 100 according to the present embodiment is the same as that of the first embodiment, the description thereof will be omitted.

(1) Substrate Processing Process

Since processes other than the surface-modifying process in the substrate processing sequence of the present embodiment are the same as those of the first embodiment, the description thereof will be omitted.

(Surface-Modifying Process)

In the surface-modifying process of the present embodiment, the H-containing gas and the O-containing gas are supplied as modifying gases into the process container 203 and are excited by plasma to generate H* as an active species containing H and generate an active species of O as an active species containing O (in the following description and drawings, the active species of O are collectively referred to as "O*") and an active species of OH as an active species containing OH (hereinafter, referred to as "OH*"). Specifically, the valve **253*b* of the H-containing gas supply system is opened to supply the H-containing gas into the process chamber 201 through the gas introduction port 234, the buffer chamber 237, and the gas discharge port 239 while adjusting the flow rate thereof by the MFC 252*b*. Further, a valve of an O-containing gas supply system (not shown) is opened to supply an $O_2$ gas into the process chamber 201 through the gas introduction port 234, the buffer chamber 237, and the gas discharge port 239 while adjusting the flow rate thereof by the MFC. At this time, high-frequency power is supplied from the high-frequency power source 273 to the resonance coil 212. As a result, inductive plasma having a doughnut shape in a plan view is excited at a height position corresponding to the electrical midpoint of the resonance coil 212 in the plasma generation space 201*a***.

As the H-containing gas, for example, an $H_2$ gas, a $D_2$ gas, an $H_2O$ gas, the aforementioned hydrogen nitride-based gases, or the like may be used. One or more of these gases can be used as the H-containing gas. As the O-containing gas, for example, an oxygen (O) gas, a nitrous oxide ($N_2O$) gas, a nitric oxide (NO) gas, a nitrogen dioxide ($NO_2$) gas, an ozone ($O_3$) gas, a water vapor ($H_2O$ gas), a carbon monoxide (CO) gas, a carbon dioxide ($CO_2$) gas, or the like may be used. One or more of these gases may be used as the O-containing gas. When the $H_2O$ gas is used as the O-containing gas, it is desirable that a gas other than the $H_2O$ gas is used as the H-containing gas.

The H-containing gas and the O-containing gas are activated (excited) by excitation of the inductive plasma or the like and react to generate H*, O*, and OH* in the process container 203. The percentages of H*, O*, and OH* can be changed depending on the percentage of H, the total gas flow rate, the RF power, and the like. The process condition is selected so as to make OH* rich. For example, the percentage of H in the gas containing H and O is 10% or more and 40% or less, more specifically 20% or more and 40% or less.

Figure 11A:
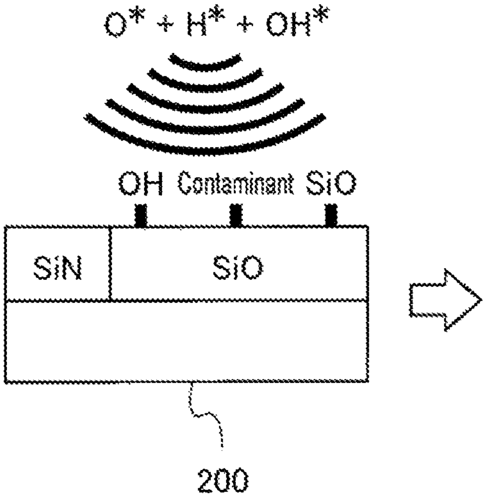
FIGS. 11A and 11B are diagrams showing details of the surface-modifying process.
Figure 11B:
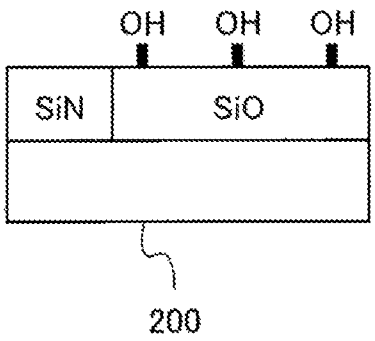

As shown in FIG. 11A, H*, O*, and OH* thus generated are then supplied to the wafer 200. As a result, as shown in FIG. 11B, the surface of the SiO film formed on the surface of the wafer 200 is modified so as to be terminated with hydroxyl groups (OH). In addition, the contaminant on the surface of the SiO film can be removed.

Further, the oxidation of the surface of the SiN film formed on the surface of the wafer 200 can be substantially prevented by appropriately selecting the process condition. For example, the oxidation rate of the SiN film varies depending on the H concentration and the temperature. Further, the effect of O* can be reduced by shortening the processing time. Therefore, even if O* is present, the oxidation of the SiN film can be substantially prevented.

The OH termination on the surface of the SiO film formed on the surface of the wafer 200 can also be generated by the mechanism described with reference to FIGS. 7A and 7B in the first embodiment, in addition to the mechanism described above. Furthermore, OH* has a strong oxidizing power against the contaminant existing on the surface of the SiO film, and the contaminant such as C or F can be removed by OH*. In addition, the contaminant can be removed by the reducing power of H*. Moreover, the contaminant such as an organic substance or the like can be removed by the oxidizing power of O*.

As described above, even when the surface-modifying process is performed by supplying the H-containing gas and the O-containing gas to the wafer 200 having the SiO film formed on the surface of the Si substrate, it is possible to perform the OH termination of the SiO film. Furthermore, it is possible to remove the termination other than the OH termination and the contaminant existing on the surface of the SiO film. In addition, the oxidation of the SiN film can be substantially prevented.

The termination other than the OH termination present on the surface of the SiO film may be either fluorine (F) termination or oxygen (O) termination. In addition, the contaminant existing on the surface of the SiO film may be an organic substance.

After performing the surface-modifying process as described above, the supply of the H-containing gas and the O-containing gas into the process container 203 is stopped, and the supply of the high-frequency power to the resonance coil 212 is stopped. Then, the inert gas as a purge gas is supplied into the process container 203 and exhausted from the exhaust pipe 231. As a result, the inside of the process container 203 is purged, and the gas and reaction by-products remaining in the process container 203 are removed from the inside of the process container 203.

(2) Effects of the Present Embodiment

As described above, the surface-modifying process is performed by supplying the H-containing gas and the O-containing gas to the wafer 200 having the SiN film and the SiO film on the surface of the Si substrate, whereby the OH termination of the SiO film can be performed. In addition, unlike the conventional DHF process using hydrofluoric acid (HF), the surface-modifying process does not use fluorine. Therefore, it is possible to modify the surface of the film without leaving fluorine behind.

In the present embodiment, the OH termination of the SiO film means that the SiO film is modified so that the OH termination is selectively formed on the surface of the SiO film while the OH termination is not formed on the surface of the SiN film, or the OH termination is formed on the surface of the SiN film at a density less than that of the OH termination formed on the surface of the SiO film.

In the present embodiment, the active species containing H and the active species containing O supplied in the surface-modifying process are generated by plasma-exciting the H- and O-containing gas, whereby the surface-modifying process can be easily realized in the modifying apparatus 100 capable of performing plasma processing as described in the above embodiments.

Further, by employing OH*, as compared with the case of using H*, it is possible to increase the density of OH termination on the SiO film. In addition, it is possible to remove the contaminant that cannot be removed or is difficult to remove with H*.

Figure 12:
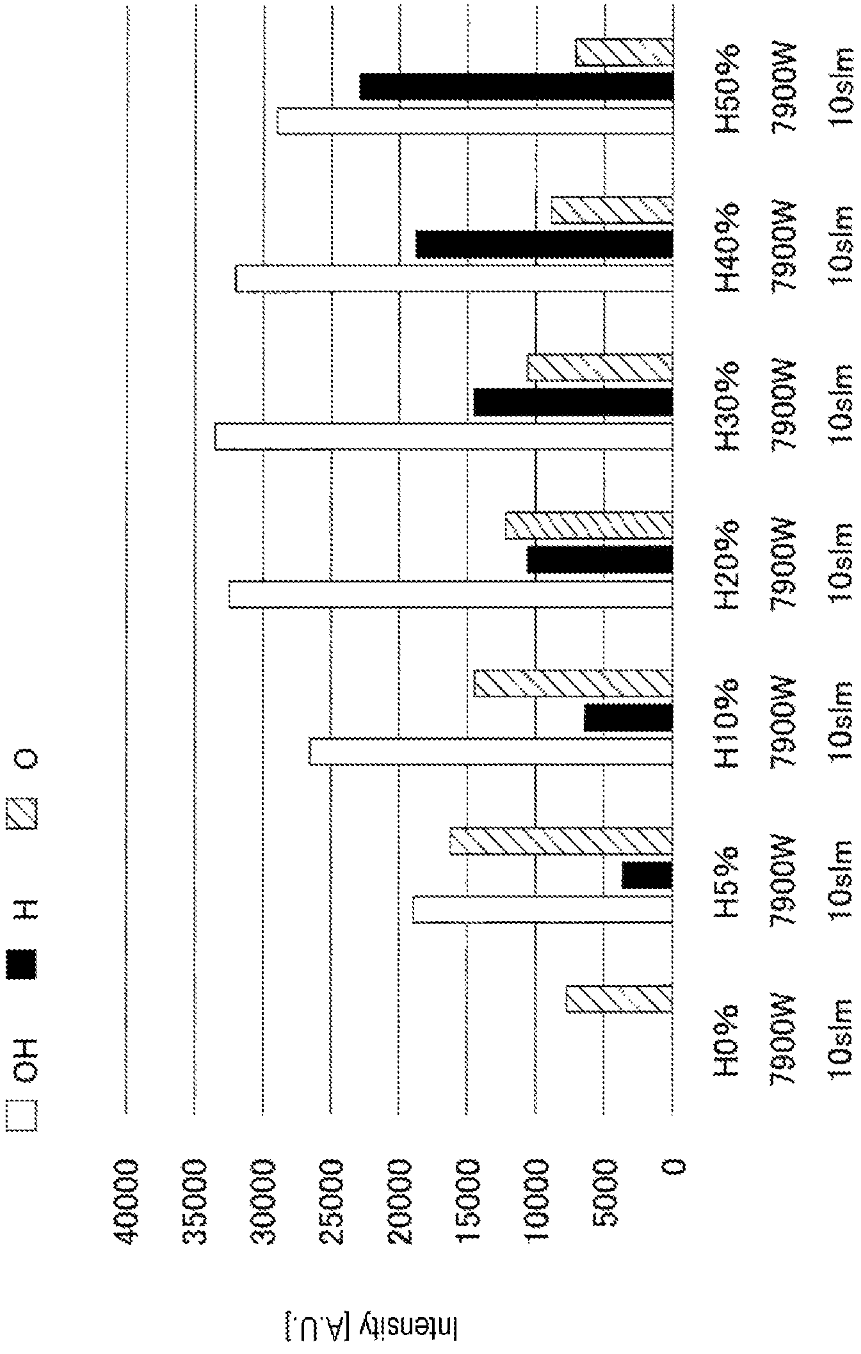
FIG. 12 is a graph showing a relationship between supply a supply condition of a gas containing hydrogen and oxygen and an amount of each active species of hydroxyl groups, hydrogen groups, and oxygen groups.
Figure 13:
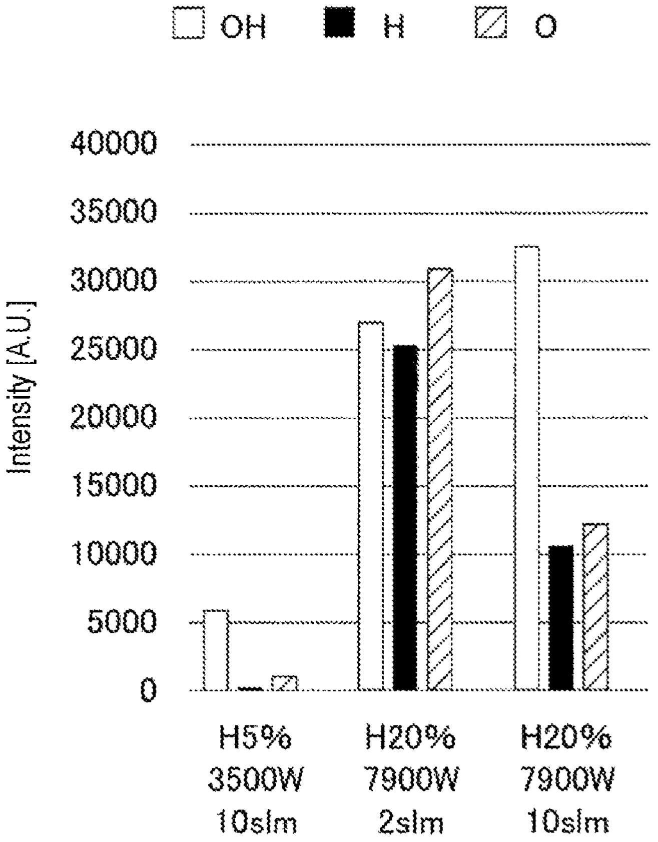
FIG. 13 is a graph showing a relationship between a supply condition of a gas containing hydrogen and oxygen and an amount of each active species of hydroxyl groups, hydrogen groups, and oxygen groups.

FIGS. 12 and 13 are graphs showing the relationship between the supply condition of the gas containing H and O and the amount of OH*, H*, and O*. The vertical axis in the graphs of FIGS. 12 and 13 indicates the intensity based on the amounts of the respective substances on the SiO film, and the unit is [A.U.]. [A.U.] is an arbitrary unit which indicates a ratio of measured values in the same measurement system.

In FIG. 12, as the gas supply conditions, there is shown a state in which only the percentage of H (%) is changed, the high-frequency power (W) is fixed to 7900 W, and the gas supply flow rate is fixed to 10 slm. The percentage of H is set to 0%, 5%, 10%, 20%, 30%, 40%, and 50%. From the graph of FIG. 12, it can be noted that, as compared to the case where the percentage of H is 10% and 50%, when the percentage of H is 20% or more and 40% or less, the intensity based on OH* increases, that is, the amount of OH* increases. Thus, it becomes possible to increase the amount of OH termination.

In FIG. 13, as the gas supply condition, there are shown three states, that is, a state in which the percentage of H is 5%, the high-frequency power is 3500 W, and the gas supply flow rate is 10 slm, a state in which the percentage of H is 20%, the high-frequency power is 7900 W, and the gas supply flow rate is 2 slm, and a state in which the percentage of H is 20%, the high-frequency power is 7900 W, and the gas supply flow rate is 10 slm.

Comparing the state of FIG. 12 in which the percentage of H is 5%, the high-frequency power is 7900 W, and the gas supply flow rate is 10 slm, with the state of FIG. 13 in which the percentage of H is 5%, the high-frequency power is 3500 W, and the gas supply flow rate is 10 slm, it can be seen that when the high-frequency power is high, the intensity based on OH* is high, that is, the amount of OH termination on the SiO film is large. Thus, it becomes possible to increase the amount of OH termination.

In addition, comparing the state of FIG. 13 in which the percentage of H is 20%, the high-frequency power is 7900 W, and the gas supply flow rate is 2 slm, with state in which the percentage of H is 20%, the high-frequency power is 7900 W, and the gas supply flow rate is 10 slm, it can be seen that when the gas supply flow rate is large, the intensity based on OH* is high, that is, the amount of OH* is large. Thus, it becomes possible to increase the amount of OH termination.

Further, by adjusting the percentage of H in the gas containing H and O, it is possible to control the ratio of the rate at which the surface of the SiN film is oxidized to the rate at which the surface of the SiO film is oxidized.

Figure 14:
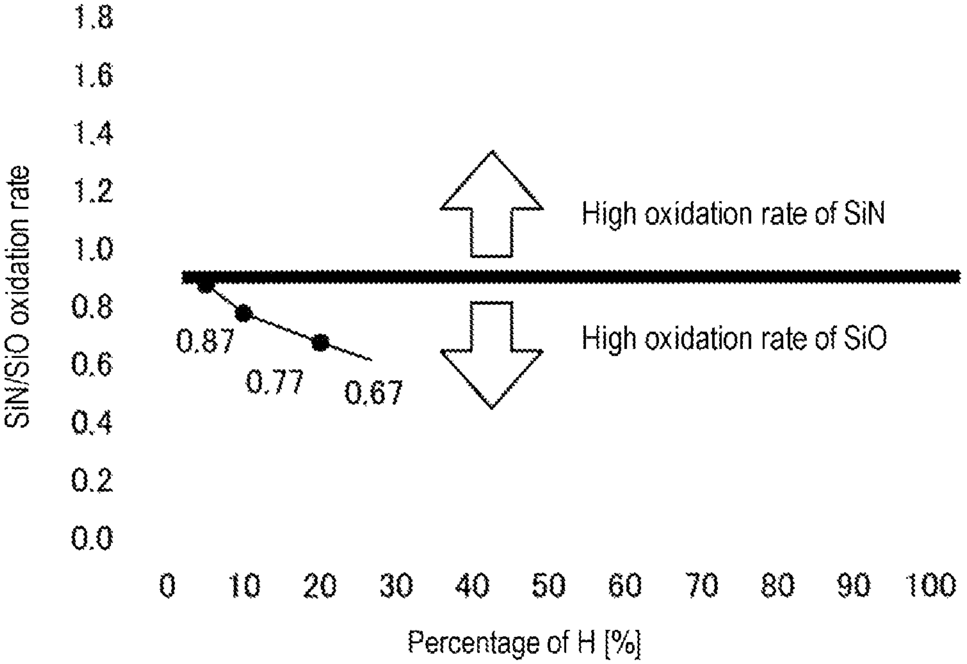
FIG. 14 is a graph showing a relationship between a ratio of hydrogen to oxygen when a hydrogen-containing gas and an oxygen-containing gas are used as a gas containing hydrogen and oxygen and a ratio of an oxidation rate of a surface of a nitrogen-containing film to an oxidation rate of a surface of an oxygen-containing film.

FIG. 14 is a graph showing the relationship between the ratio of the number of H atoms to the total number of O and H atoms contained in the gas containing H and O, and the ratio of the rate at which the surface of the SiN film is oxidized to the rate at which the surface of the SiO film is oxidized. The vertical axis in the graph of FIG. 14 indicates the ratio of the rate at which the surface of the SiN film is oxidized to the rate at which the surface of the SiO film is oxidized. This ratio has no unit. The horizontal axis in the graph of FIG. 14 indicates the percentage of H in the gas containing H and O. The unit of this percentage is [%].

From the graph of FIG. 14, it can be seen that the higher the percentage of H, the lower the rate at which the surface of the SiN film is oxidized, and the higher the rate at which the surface of the SiO film is oxidized. Using such characteristics, it is possible to adjust the rate at which the surface of the SiO film is oxidized and the rate at which the surface of the SiN film is oxidized.

Other Embodiments

The embodiments of the present disclosure have been specifically described above. However, the present disclosure is not limited to the above-described embodiments, and various modifications may be made without departing from the scope of the present disclosure.

For example, as the modifying apparatus, a single-substrate-type substrate processing apparatus that processes one substrate at a time may be used to form a film. Alternatively, as the modifying apparatus, a substrate processing apparatus, which is a batch-type vertical apparatus that processes a plurality of substrates at a time, may be used to form a film. Further, although the SiN film is exemplified as the nitrogen-containing film, the nitrogen-containing film is not limited thereto and may be, for example, a SiN film, a SiCN film, a SiBN film, a SiBCN film, an N-rich SiON film, or an N-rich SiOCN. Further, although the SiO film is exemplified as the oxygen-containing film, the oxygen-containing film is not limited thereto and may be, for example, a SiO film, a SiOC film, an O-rich SiON film, or an O-rich SiOCN film. That is, any type of film may be employed as the nitrogen-containing film and the oxygen-containing film as long as the selectivity can be obtained. Further, the present disclosure may be carried out by mixing any of OH* processing, NH* processing, and H* processing. For example, after a large amount of OH termination is formed on the SiO film by using OH* processing, the amount of OH termination of the SiO film may be increased while nitriding or reducing the surface of the SiO film by using the NH* processing or H* processing. Further, although the TiN film is exemplified, other films such as a SiN film, a SiO film, or a film of metal other than Ti may be formed as appropriate.

Further, the substrate processing system, the modifying apparatus, and the film forming apparatus according to the embodiments of the present disclosure are applicable not only to a semiconductor manufacturing apparatus for manufacturing a semiconductor, but also to an apparatus for processing a glass substrate, such as an LCD apparatus or the like. Further, the substrate processing process applicable to the substrate processing system includes, for example, CVD, PVD, processes for forming an oxide film and a nitride film, a process for forming a film containing metal, an annealing process, an oxidation process, a nitriding process, a diffusion process, and the like. It goes without saying that the present disclosure can also be applied to various substrate processing apparatuses such as an exposure apparatus, a coating apparatus, a drying apparatus, a heating apparatus, and the like.

According to the present disclosure in some embodiments, it is possible to selectively modify the surfaces of a plurality of different types of films for each type of film without leaving fluorine behind.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:

(a) preparing the substrate having a nitrogen-containing film and an oxygen-containing film on a surface of the substrate, an oxygen- and nitrogen-containing layer being formed on a surface of the nitrogen-containing film; and (b) modifying the oxygen- and nitrogen-containing layer to be nitrided while releasing oxygen contained in the oxygen- and nitrogen-containing layer by supplying an active species containing nitrogen and an active species containing hydrogen, or selectively forming hydroxyl group termination on a surface of the oxygen-containing film by supplying at least one selected from the group of an active species containing hydrogen, an active species containing hydrogen and oxygen, and an active species containing hydrogen and nitrogen.

2. The method of claim 1, wherein in (b), by supplying the active species containing nitrogen and the active species containing hydrogen, the nitrogen-containing film is modified so as to increase a nitrogen concentration of the surface of the nitrogen-containing film by a first increment amount, and the oxygen-containing film is modified so as to increase a nitrogen concentration of the surface of the oxygen-containing film by a second increment amount smaller than the first increment amount or so as not to increase the nitrogen concentration of the surface of the oxygen-containing film.

3. The method of claim 1, further comprising:

(c) forming a film-forming inhibition layer by supplying a film-forming inhibitor to the substrate having the surface of the oxygen-containing film terminated with hydroxyl groups and adsorbing at least a part of molecular structures of molecules constituting the film-forming inhibitor onto the surface of the oxygen-containing film, after modifying the surface of the nitrogen-containing film to be nitrided in (b).

4. The method of claim 1, wherein the active species containing nitrogen and the active species containing hydrogen are generated by plasma-exciting a gas containing nitrogen and hydrogen.

5. The method of claim 4, wherein the gas containing nitrogen and hydrogen is at least one selected from the group of a mixed gas of a nitrogen-containing gas and a hydrogen-containing gas, and a gas containing a chemical bond of nitrogen and hydrogen (N—H bond).

6. The method of claim 5, wherein the mixed gas of the nitrogen-containing gas and the hydrogen-containing gas is a mixed gas of a nitrogen gas ($N_2$) and a hydrogen gas ($H_2$).

7. The method of claim 6, wherein a percentage of a number of H atoms in the hydrogen gas ($H_2$) out of a total number of N and H atoms in the mixed gas of the nitrogen-containing gas and the hydrogen-containing gas is 20% or more and 60% or less.

8. The method of claim 5, wherein the gas containing the chemical bond of nitrogen and hydrogen is at least one selected from the group of an ammonia ($NH_3$) gas, a hydrazine ($N_2H_4$) gas, and a diazene ($N_2H_2$) gas.

9. The method of claim 1, wherein in (b), with respect to the substrate, hydroxyl group termination is selectively formed on the surface of the oxygen-containing film, and hydroxyl group termination is not formed on the surface of the nitrogen-containing film or hydroxyl group termination is formed on the surface of the nitrogen-containing film at a density less than a density of the hydroxyl group termination formed on the surface of the oxygen-containing film.

10. The method of claim 1, wherein the active species containing hydrogen do not contain oxygen.

11. The method of claim 1, wherein the active species containing hydrogen and oxygen is generated by plasma-exciting a gas containing hydrogen and oxygen.

12. The method of claim 11, wherein a ratio of a rate at which the surface of the nitrogen-containing film is oxidized to a rate at which the surface of the oxygen-containing film is oxidized is controlled by adjusting a percentage of hydrogen in the gas containing hydrogen and oxygen.

13. The method of claim 1, wherein the oxygen- and nitrogen-containing layer formed on the surface of the nitrogen-containing film is reduced to the nitrogen-containing film by supplying an active species containing hydrogen to the substrate.

14. The method of claim 1, further comprising:

(c) forming a film-forming inhibition layer by supplying a film-forming inhibitor to the substrate having the surface of the oxygen-containing film terminated with hydroxyl groups and adsorbing at least a part of molecular structures of molecules constituting the film-forming inhibitor onto the surface of the oxygen-containing film, after (b).

15. A method of manufacturing a semiconductor device by using the method of claim 1.

16. The method of claim 1, wherein, after modifying the oxygen- and nitrogen-containing layer to be nitrided while releasing oxygen contained in the oxygen- and nitrogen-containing layer, the oxygen released from the oxygen- and nitrogen-containing layer is bonded with the active species containing nitrogen and supplied to the surface of the oxygen-containing film so as to re-oxidize the oxygen-containing film, or form termination containing oxygen and hydrogen is formed on the oxygen-containing film.

17. The method of claim 1, wherein the oxygen- and nitrogen-containing layer further contains silicon, the nitrogen-containing film consists of the oxygen- and nitrogen-containing layer and a film containing nitrogen and silicon provided below the oxygen- and nitrogen-containing layer, and wherein the method further comprises, after modifying the oxygen- and nitrogen-containing layer to be nitrided while releasing oxygen contained in the oxygen- and nitrogen-containing layer, supplying a metal-containing gas to the modified oxygen- and nitrogen-containing layer to form a metal-containing film on the modified oxygen- and nitrogen-containing layer.

18. The method of claim 1, wherein the oxygen- and nitrogen-containing layer further contains silicon, the nitrogen-containing film consists of the oxygen- and nitrogen-containing layer and a film containing nitrogen and silicon provided below the oxygen- and nitrogen-containing layer, and the active species containing nitrogen and the active species containing hydrogen are supplied to the oxygen- and nitrogen-containing layer so as to release oxygen while leaving nitrogen and silicon contained in the oxygen- and nitrogen-containing layer and to nitride the oxygen- and nitrogen-containing layer, thereby modifying the oxygen- and nitrogen-containing layer such that the oxygen- and nitrogen-containing layer and the film containing nitrogen and silicon have the same composition.

* * * * *